US012609667B2

(12) United States Patent
Matsumoto

(10) Patent No.: US 12,609,667 B2
(45) Date of Patent: Apr. 21, 2026

(54) MULTILAYERED FILTER DEVICE

(71) Applicant: TDK CORPORATION, Tokyo (JP)

(72) Inventor: Yuki Matsumoto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 129 days.

(21) Appl. No.: 18/602,398

(22) Filed: Mar. 12, 2024

(65) Prior Publication Data

US 2024/0322778 A1     Sep. 26, 2024

(30) Foreign Application Priority Data

Mar. 24, 2023     (JP) ................................. 2023-047894

(51) Int. Cl.
H03H 7/01          (2006.01)
H03H 1/00          (2006.01)
(52) U.S. Cl.
CPC ........ H03H 7/0115 (2013.01); H03H 7/0161 (2013.01); H03H 2001/0085 (2013.01)
(58) Field of Classification Search
CPC ......... H03H 7/0115; H03H 2001/0085; H03H 7/1708; H03H 7/1775; H03H 7/1766; H03H 7/0161; H03H 7/1758; H03H 7/09; H03H 7/1725; H03H 7/463; H03H 7/0123; H03H 7/0138; H03H 7/1791; H03H 7/0169; H03H 7/075; H03H 7/17;

H03H 7/1741; H03H 7/425; H03H 9/0561; H01F 2017/0026; H01F 2027/2809; H01F 27/2804; H01F 17/0013; H01F 27/40; H01F 27/292; H01F 2017/002; H01F 19/04; H01F 2017/004; H01G 4/30; H01G 4/40; H01G 4/012; H01G 4/38
See application file for complete search history.

(56)          References Cited

U.S. PATENT DOCUMENTS

| | | | | |
|---|---|---|---|---|
| 12,323,122 | B2 * | 6/2025 | Tatematsu | ........... H01F 17/0013 |
| 2016/0156324 | A1 | 6/2016 | Watanabe | |
| 2018/0013395 | A1 * | 1/2018 | Asada | ................. H01F 17/0013 |
| 2021/0344320 | A1 * | 11/2021 | Sawaguchi | .............. H03H 7/09 |

* cited by examiner

*Primary Examiner* — Lincoln D Donovan
*Assistant Examiner* — Tyler J Pereny
(74) *Attorney, Agent, or Firm* — Oliff PLC

(57)          ABSTRACT

Each of a plurality of resonators of a filter device is wound around an axis orthogonal to a stacking direction of a plurality of dielectric layers of a stack and is arranged in a manner that an opening of each of the resonators faces one or more openings of one or two other resonators. The plurality of resonators include a first resonator and a second resonator adjacent to each other in a circuit configuration. Each of the first resonator and the second resonator includes a first portion and a second portion arranged with a certain distance in a direction parallel to the axis. The second portion of the first resonator and the first portion of the second resonator are adjacent to each other.

12 Claims, 10 Drawing Sheets

54T4d 54T3d 54T2a 54T1a
543      542      541

54T4a  54T3a  54T2d  54T1d

55T4d  55T3d  55T2c  55T1c
55T4b| 55T3b| 55T2a| 55T1a

|55T4a| 55T3a| 55T2b| 55T1b
55T4c  55T3c  55T2d  55T1d

56T4d  56T3d  56T2c  56T1c
56T4b| 56T3b| 56T2a| 56T1a

|56T4a| 56T3a| 56T2b| 56T1b
56T4c  56T3c  56T2d  56T1d

MULTILAYERED FILTER DEVICE

CROSS REFERENCE TO RELATED APPLICATIONS

This application claims the benefit of Japanese Priority Patent Application No. 2023-47894 filed on Mar. 24, 2023, the entire contents of which are incorporated herein by reference.

BACKGROUND OF THE INVENTION

1. Field of the Invention

The present invention relates to a multilayered filter device including a plurality of resonators.

2. Description of the Related Art

One of electronic components used in a communication apparatus is a band-pass filter including a plurality of resonators. Miniaturization of band-pass filters used in small-sized communication apparatuses, in particular, has been desired. One known example of a band-pass filter suitable for downsizing is a band-pass filter using a stack including a plurality of dielectric layers and a plurality of conductor layers stacked together.

One known example of such a resonator used for a band-pass filter using a stack is an inductor or a resonator wound around an axis orthogonal to a stacking direction of a plurality of dielectric layers as described in US 2016/0156324 A1, for example. US 2016/0156324 A1 discloses a resonator that includes an inductor composed of a plurality of conductor layers and a plurality of interlayer connection conductors (via hole conductors) and is wound around an axis orthogonal to a stacking direction of a plurality of insulator layers. The inductor of US 2016/0156324 A1 includes a first portion on an outer peripheral side and a second portion on an inner peripheral side partially arranged on an inner side of the first portion.

Recent small-sized communication apparatuses are strongly demanded to be smaller and thinner, and electronic components used for such communication apparatuses are also demanded to be smaller and thinner. Here, consider to reduce the thickness of a band-pass filter including a resonator wound around an axis orthogonal to a stacking direction of a plurality of dielectric layers. In this case, reduction in size of an opening of the resonator reduces the Q value of the resonator and also reduces the inductance of the resonator. This consequently prevents desired characteristics from being obtained in some cases. In particular, an inductor including a portion on an outer peripheral side and a portion on an inner peripheral side as the inductor described in US 2016/0156324 A1 has an opening of the portion on the inner peripheral side relatively significantly reduced in size.

The above-described problem applies to multilayered filter devices in general including a plurality of resonators without being limited to a band-pass filter.

SUMMARY OF THE INVENTION

An object of the present invention is to provide a multilayered filter device that can be miniaturized while achieving desired characteristics.

A multilayered filter device of the present invention includes a first signal terminal, a second signal terminal, a plurality of resonators provided between the first signal terminal and the second signal terminal in a circuit configuration, and a stack for integrating the first signal terminal, the second signal terminal, and the plurality of resonators, the stack including a plurality of dielectric layers stacked together. Each of the plurality of resonators is wound around an axis orthogonal to a stacking direction of the plurality of dielectric layers and is arranged in a manner that an opening of the resonator faces one or more openings of one or two other resonators among the plurality of resonators. The plurality of resonators include a first resonator and a second resonator adjacent to each other in a circuit configuration. Each of the first resonator and the second resonator includes a first portion and a second portion arranged with a certain distance in a direction parallel to the axis. The second portion of the first resonator and the first portion of the second resonator are adjacent to each other.

In the multilayered filter device of the present invention, each of the first resonator and the second resonator includes a first portion and a second portion arranged with a certain distance in a direction parallel to an axis. The second portion of the first resonator and the first portion of the second resonator are adjacent to each other. Thus, according to the present invention, it is possible to provide a multilayered filter device that can be miniaturized while achieving desired characteristics.

Other and further objects, features, and advantages of the present invention will appear more fully from the following description.

DETAILED DESCRIPTION OF THE PREFERRED EMBODIMENTS

First Embodiment

Figure 1:
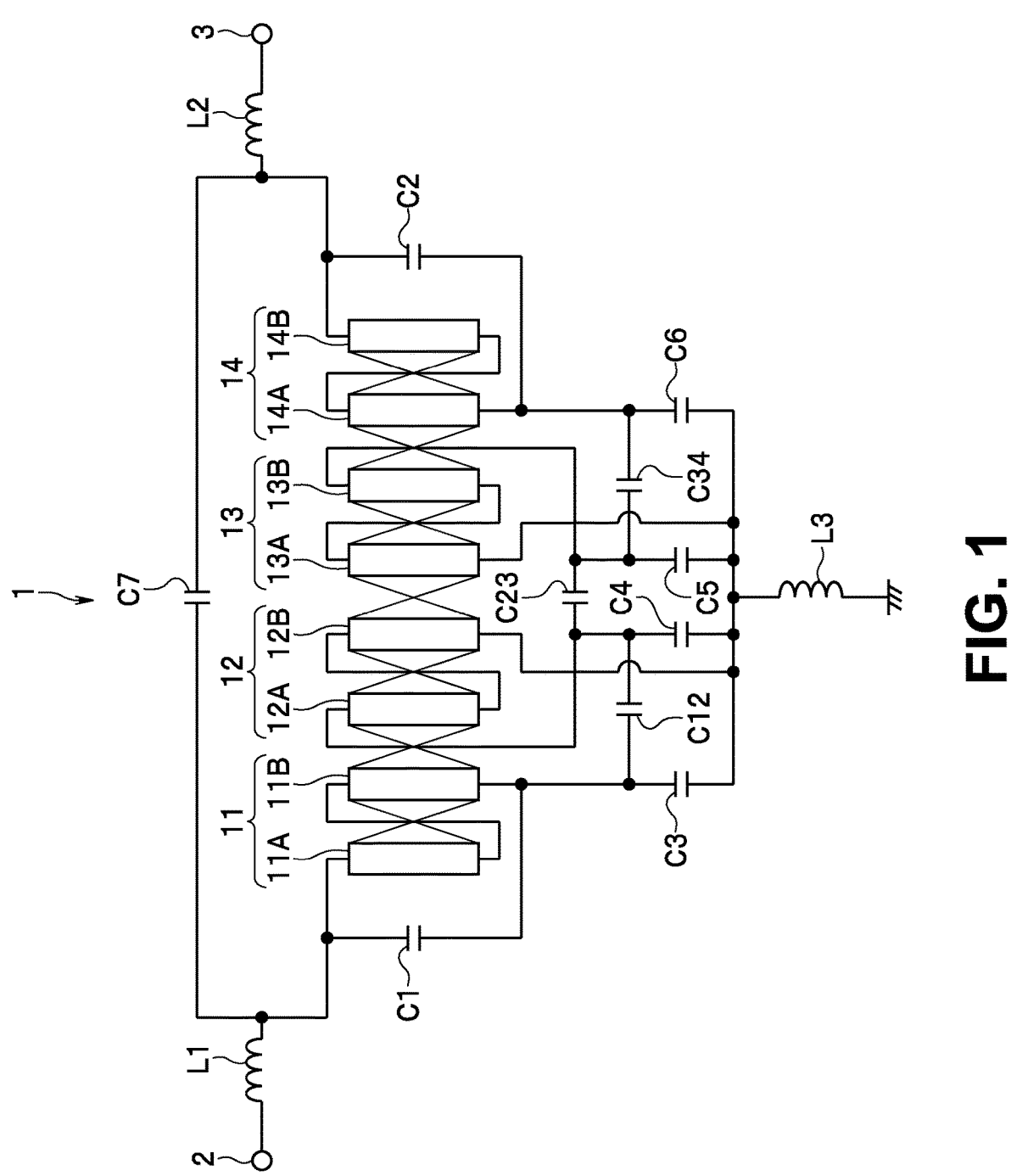
FIG. 1 is a circuit diagram showing a circuit configuration of a multilayered filter device according to a first embodiment of the present invention.

An embodiment of the present invention will be described below in detail with reference to the drawings. First, reference is made to FIG. 1 to outline a configuration of a multilayered filter device (hereinafter referred to simply as a filter device) 1 according to the present embodiment. FIG. 1 is a circuit diagram showing a circuit configuration of the filter device 1. FIG. 1 shows a band-pass filter as an example of the filter device 1. The filter device 1 includes a first signal terminal 2, a second signal terminal 3, and a plurality of resonators.

Each of the first and second signal terminals 2 and 3 is a terminal for inputting or outputting a signal. In other words, when a signal is input to the first signal terminal 2, a signal is output from the second signal terminal 3. When a signal is input to the second signal terminal 3, a signal is output from the first signal terminal 2.

In the present embodiment, the plurality of resonators are four resonators 11, 12, 13, and 14. The resonators 11 to 14 are arranged between the first signal terminal 2 and the second signal terminal 3 in a circuit configuration. Note that, in the present application, the expression "in the (a) circuit configuration" is used to indicate not a layout in a physical configuration but a layout in a circuit diagram.

The resonator 11 is connected to the first signal terminal 2. The resonator 14 is connected to the second signal terminal 3. The resonators 12 and 13 are arranged between the resonator 11 and the resonator 14 in the circuit configuration. In particular, in the present embodiment, the resonators 11, 12, 13, and 14 are provided in this order from the first signal terminal 2 toward the second signal terminal 3.

The resonators 11 to 14 include a first resonator and a second resonator adjacent to each other in the circuit configuration. In particular, in the present embodiment, the resonators 11 to 14 include a pair of the resonators 11 and 12, a pair of the resonators 12 and 13, and a pair of the resonators 13 and 14 as pairs of the first and second resonators. In other words, the resonators 11 and 12 are adjacent to each other in the circuit configuration, the resonators 12 and 13 are adjacent to each other in the circuit configuration, and the resonators 13 and 14 are adjacent to each other in the circuit configuration.

In the pair of the resonators 11 and 12, the resonator 11 corresponds to the first resonator, and the resonator 12 corresponds to the second resonator. In the pair of the resonators 12 and 13, the resonator 12 corresponds to the first resonator, and the resonator 13 corresponds to the second resonator. In the pair of the resonators 13 and 14, the resonator 13 corresponds to the first resonator, and the resonator 14 corresponds to the second resonator.

Each of the first resonator and the second resonator includes a first portion and a second portion. In particular, in the present embodiment, the first portion and the second portion are connected in series. In each of the first and second resonators, no other element may be connected between the first portion and the second portion.

In the following, the first portion and the second portion of the resonator 11 are denoted respectively by reference numerals 11A and 11B, the first portion and the second portion of the resonator 12 are denoted respectively by reference numerals 12A and 12B, the first portion and the second portion of the resonator 13 are denoted respectively by reference numerals 13A and 13B, and the first portion and the second portion of the resonator 14 are denoted respectively by reference numerals 14A and 14B.

Here, a relationship between the first portions and the second portions will be described by focusing on the pair of the resonators 11 and 12. The second portion 11B of the resonator 11 and the first portion 12A of the resonator 12 are arranged between the first portion 11A of the resonator 11 and the second portion 12B of the resonator 12 in the circuit configuration. The second portion 11B and the first portion 12A are adjacent to each other in the circuit configuration and are also electromagnetically coupled with each other with magnetic coupling as main coupling. The electromagnetic coupling between the second portion 11B and the first portion 12A is stronger than electromagnetic coupling between the first portion 11A and the first portion 12A and is stronger than electromagnetic coupling between the second portion 11B and the second portion 12B.

The above description related to the pair of the resonators 11 and 12 also applies to the pair of the resonators 12 and 13 and the pair of the resonators 13 and 14.

Next, an example of a circuit configuration of the filter device 1 will be described with reference to FIG. 1. The filter device 1 further includes inductors L1, L2, and L3 and capacitors C1, C2, C3, C4, C5, C6, C7, C12, C23, and C34.

One end of the inductor L1 is connected to the first signal terminal 2. The other end of the inductor L1 is connected to one end of the first portion 11A of the resonator 11. The other end of the first portion 11A is connected to one end of the second portion 11B of the resonator 11. One end of the capacitor C1 is connected to the one end of the first portion 11A. The other end of the capacitor C1 and one end of the capacitor C12 are connected to the other end of the second portion 11B.

The other end of the capacitor C12 is connected to one end of the first portion 12A of the resonator 12. The other end of the first portion 12A is connected to one end of the second portion 12B of the resonator 12. The other end of the second portion 12B is grounded via the inductor L3.

One end of the first portion 13A of the resonator 13 is grounded via the inductor L3. The other end of the first portion 13A is connected to one end of the second portion 13B of the resonator 13.

One end of the capacitor C23 is connected to the one end of the first portion 12A of the resonator 12. The other end of the capacitor C23 and one end of the capacitor C34 are connected to the other end of the second portion 13B of the resonator 13.

The other end of the capacitor C34 and one end of the capacitor C2 are connected to one end of the first portion 14A of the resonator 14. The other end of the first portion 14A is connected to one end of the second portion 14B of the resonator 14. The other end of the capacitor C2 and one end of the inductor L2 are connected to the other end of the second portion 14B. The other end of the inductor L2 is connected to the second signal terminal 3.

One end of the capacitor C3 is connected to the other end of the second portion 11B of the resonator 11. One end of the capacitor C4 is connected to the one end of the first portion 12A of the resonator 12. One end of the capacitor C5 is connected to the other end of the second portion 13B of the resonator 13. One end of the capacitor C6 is connected to the one end of the first portion 14A of the resonator 14. The other end of each of the capacitors C3 to C6 is grounded via the inductor L3.

One end of the capacitor C7 is connected to the other end of the inductor L1. The other end of the capacitor C7 is connected to the one end of the inductor L2.

Each of the resonators 12 and 13 is electrically grounded via the inductor L3. Each of the resonators 11 and 14 is not electrically grounded.

Note that a mode in which a resonator is electrically grounded includes a mode in which a resonator is directly grounded via a conductor in addition to a mode in which a resonator is connected via an inductor as the resonators 12 and 13. Meanwhile, a mode in which a conductor in a path connecting a resonator and the ground is interrupted, for example, by a capacitor as the resonators 11 and 14 is not included in the mode in which a resonator is electrically grounded.

In the example shown in FIG. 1, the filter device 1 has a circuit configuration symmetric with respect to the inductor L3 and the capacitor C23.

Figure 2:
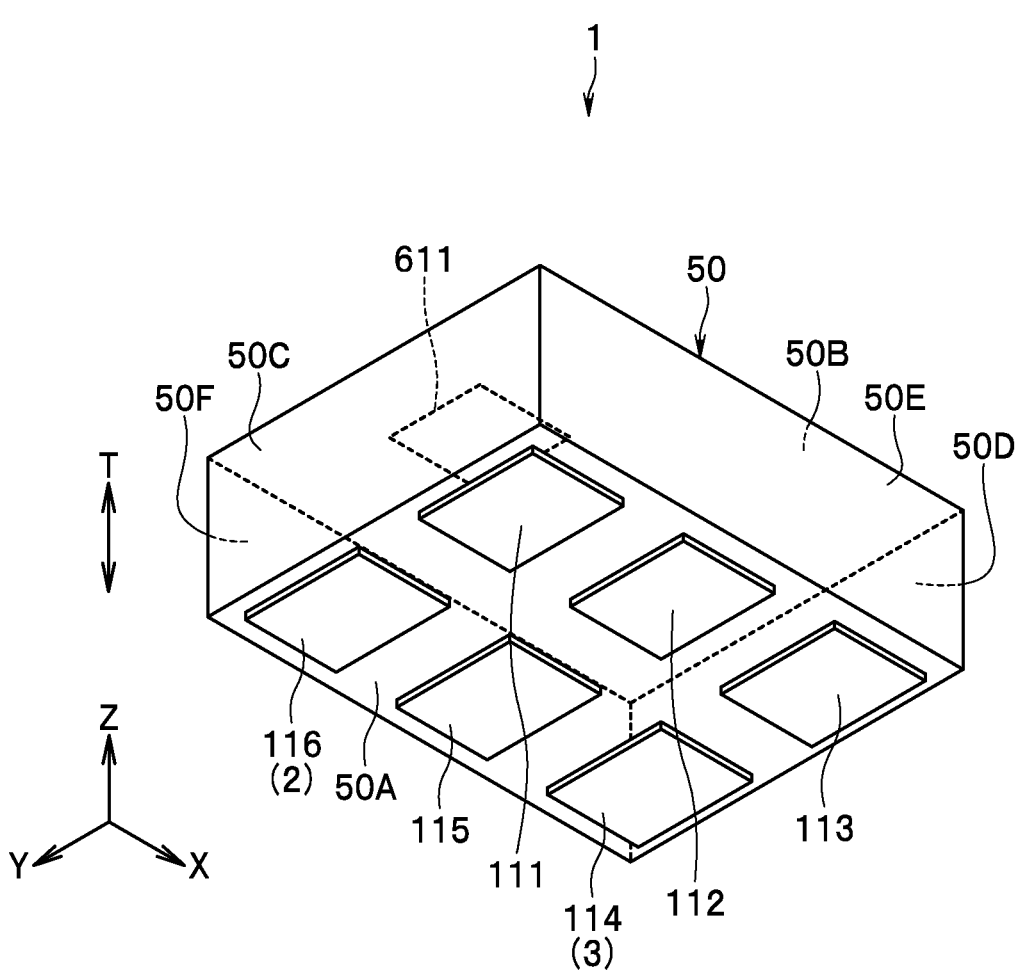
FIG. 2 is a perspective view showing an external appearance of the multilayered filter device according to the first embodiment of the present invention.

Next, other configurations of the filter device 1 will be described with reference to FIG. 2. FIG. 2 is a perspective view showing an external appearance of the filter device 1.

The filter device 1 further includes a stack 50 including a plurality of dielectric layers stacked together and a plurality of conductors (plurality of conductor layers and plurality of through holes). The first signal terminal 2, the second signal terminal 3, the resonators 11 to 14, the inductors L1 to L3, and the capacitors C1 to C7, C12, C23, and C34 are integrated with the stack 50.

The stack 50 has a bottom surface 50A and a top surface 50B located at both ends in a stacking direction T of the plurality of dielectric layers, and four side surfaces 50C to 50F connecting the bottom surface 50A and the top surface 50B. The side surfaces 50C and 50D are opposite to each other. The side surfaces 50E and 50F are opposite to each other. The side surfaces 50C to 50F are perpendicular to the bottom surface 50A and the top surface 50B.

Here, as shown in FIG. 2, an X direction, a Y direction, and a Z direction are defined. The X direction, the Y direction, and the Z direction are orthogonal to one another. In the present embodiment, a direction parallel to the stacking direction T is defined as the Z direction. A direction opposite to the X direction is defined as a −X direction, a direction opposite to the Y direction is defined as a −Y direction, and a direction opposite to the Z direction is defined as a −Z direction. The expression of "when seen from the stacking direction T" means that an object is seen from a position away in the Z direction or the −Z direction.

As shown in FIG. 2, the bottom surface 50A is located at the end of the stack 50 in the −Z direction. The top surface 50B is located at the end of the stack 50 in the Z direction. The side surface 50C is located at the end of the stack 50 in the −X direction. The side surface 50D is located at the end of the stack 50 in the X direction. The side surface 50E is located at the end of the stack 50 in the −Y direction. The side surface 50F is located at the end of the stack 50 in the Y direction.

The filter device 1 further includes electrodes 111, 112, 113, 114, 115, and 116 disposed on the bottom surface 50A of the stack 50. The electrodes 111, 112, and 113 are arranged in this order in the X direction at a position closer to the side surface 50E than the side surface 50F. The electrodes 114, 115, and 116 are arranged in this order in the −X direction at a position closer to the side surface 50F than the side surface 50E.

The electrode 116 corresponds to the first signal terminal 2, and the electrode 114 corresponds to the second signal terminal 3. The first and second signal terminals 2 and 3 are thus disposed on the bottom surface 50A of the stack 50. The electrodes 111 to 113 and 115 are grounded.

Next, an example of the plurality of dielectric layers and the plurality of conductors constituting the stack 50 will be described with reference to FIG. 3A to FIG. 6. In this example, the stack 50 includes eleven dielectric layers stacked together. The eleven dielectric layers will be referred to below as first to eleventh dielectric layers in the order from bottom to top. The first to eleventh dielectric layers are denoted by reference numerals 51 to 61, respectively.

In FIG. 3A to FIG. 5B, each circle represents a through hole. The dielectric layers 51 to 59 each have a plurality of through holes. The plurality of through holes are each formed by filling a hole intended for a through hole with a conductive paste. Each of the plurality of through holes is connected to an electrode, a conductor layer, or another through hole. In the following description, for a connection relationship between each of the plurality of through holes and an electrode, a conductor layer, or another through hole, the connection relationship in a state where the first to eleventh dielectric layers 51 to 61 are stacked together is described. In FIG. 3A to FIG. 5B, a plurality of specific through holes among the plurality of through holes are denoted by reference numerals.

Figure 3A:
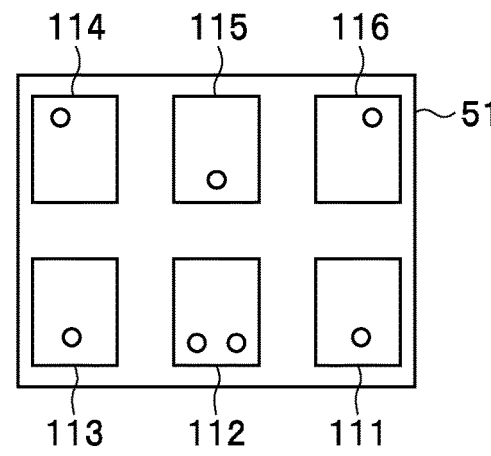
FIG. 3A to FIG. 3C are explanatory diagrams showing respective patterned surfaces of first to third dielectric layers of a stack of the multilayered filter device according to a first embodiment of the present invention.

FIG. 3A shows a patterned surface of the first dielectric layer 51. The electrodes 111 to 116 are formed on the patterned surface of the dielectric layer 51.

Figure 3B:
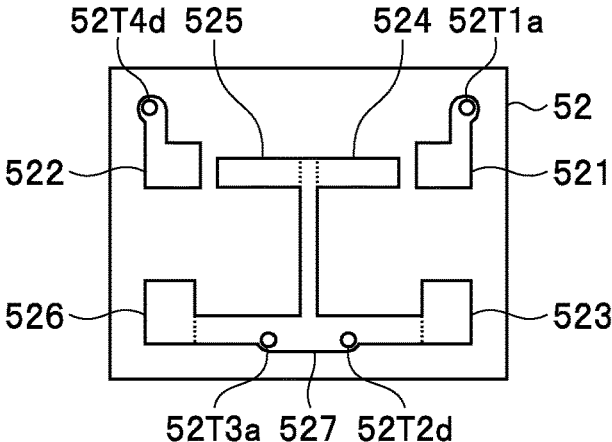

FIG. 3B shows a patterned surface of the second dielectric layer 52. Conductor layers 521, 522, 523, 524, 525, 526, and 527 are formed on the patterned surface of the dielectric layer 52. The conductor layers 523 to 526 are connected to the conductor layer 527. In FIG. 3B, each boundary between two conductor layers is indicated by a dotted line.

The through hole denoted by a reference numeral 52T1*a* in FIG. 3B is connected to the conductor layer 521. Note that the through hole denoted by the reference numeral 52T1*a* will be simply referred to as a through hole 52T1*a* in the following description. The through holes denoted by other reference numerals than the through hole 52T1*a* are referred to similarly to the through hole 52T1*a*.

The through holes 52T2*d* and 52T3*a* shown in FIG. 3B are connected to the conductor layer 527. The through hole 52T4*d* shown in FIG. 3B is connected to the conductor layer 522.

Figure 3C:
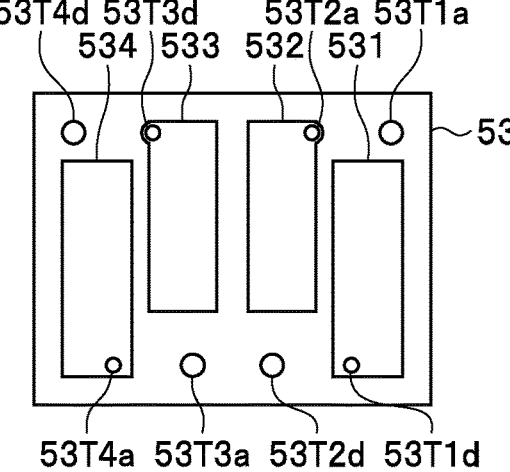

FIG. 3C shows a patterned surface of the third dielectric layer 53. Conductor layers 531, 532, 533, and 534 are formed on the patterned surface of the dielectric layer 53. The through holes 52T1*a*, 52T2*d*, 52T3*a*, and 52T4*d* are connected respectively to the through holes 53T1*a*, 53T2*d*, 53T3*a*, and 53T4*d* shown in FIG. 3C. Through holes 53T1*d*, 53T2*a*, 53T3*d*, and 53T4*a* shown in FIG. 3C are connected respectively to the conductor layers 531, 532, 533, and 534.

Figure 4A:
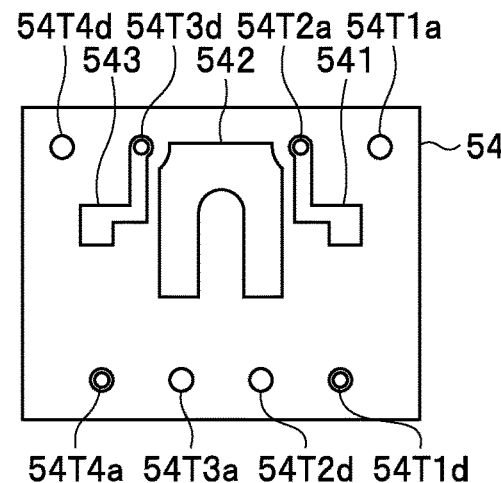
FIG. 4A to FIG. 4C are explanatory diagrams showing respective patterned surfaces of fourth to sixth dielectric layers of the stack of the multilayered filter device according to the first embodiment of the present invention.

FIG. 4A shows a patterned surface of the fourth dielectric layer 54. Conductor layers 541, 542, and 543 are formed on the patterned surface of the dielectric layer 54. The through holes 53T1*a*, 53T1*d*, 53T2*d*, 53T3*a*, 53T4*a*, and 53T4*d* are connected respectively to the through holes 54T1*a*, 54T1*d*, 54T2*d*, 54T3*a*, 54T4*a*, and 54T4*d* shown in FIG. 4A. The through hole 53T2*a*, and the through hole 54T2*a* shown in FIG. 4A are connected to the conductor layer 541. The through hole 53T3d, and the through hole 54T3d shown in FIG. 4A are connected to the conductor layer 543.

Figure 4B:
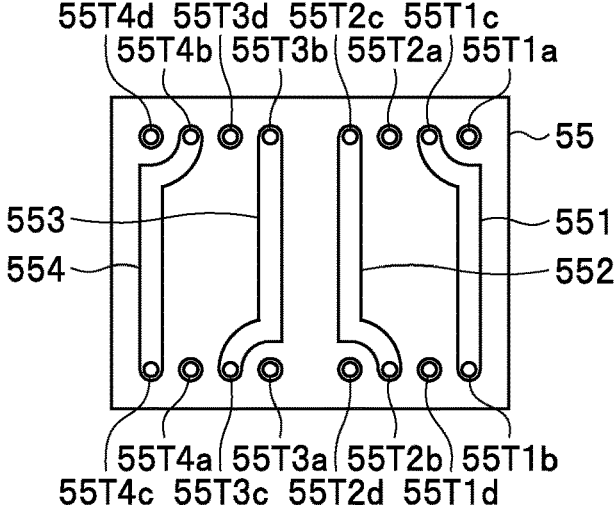

FIG. 4B shows a patterned surface of the fifth dielectric layer 55. Resonator conductor layers 551, 552, 553, and 554 are formed on the patterned surface of the dielectric layer 55. The conductor layer 551 has a first end and a second end located at both ends of the conductor layer 551 in a longitudinal direction. Each of the conductor layers 552 to 554 and resonator conductor layers other than the conductor layer 551 to be described below also has a first end and a second end located at both ends of the conductor layer in a longitudinal direction.

The through holes 54T1a, 54T1d, 54T2a, 54T2d, 54T3a, 54T3d, 54T4a, and 54T4d are connected respectively to the through holes 55T1a, 55T1d, 55T2a, 55T2d, 55T3a, 55T3d, 55T4a, and 55T4d shown in FIG. 4B.

The through hole 55T1b shown in FIG. 4B is connected to a portion near the first end of the conductor layer 551. The through hole 55T1c shown in FIG. 4B is connected to a portion near the second end of the conductor layer 551.

The through hole 55T2b shown in FIG. 4B is connected to a portion near the first end of the conductor layer 552. The through hole 55T2c shown in FIG. 4B is connected to a portion near the second end of the conductor layer 552.

The through hole 55T3b shown in FIG. 4B is connected to a portion near the first end of the conductor layer 553. The through hole 55T3c shown in FIG. 4B is connected to a portion near the second end of the conductor layer 553.

The through hole 55T4b shown in FIG. 4B is connected to a portion near the first end of the conductor layer 554. The through hole 55T4c shown in FIG. 4B is connected to a portion near the second end of the conductor layer 554.

Figure 4C:
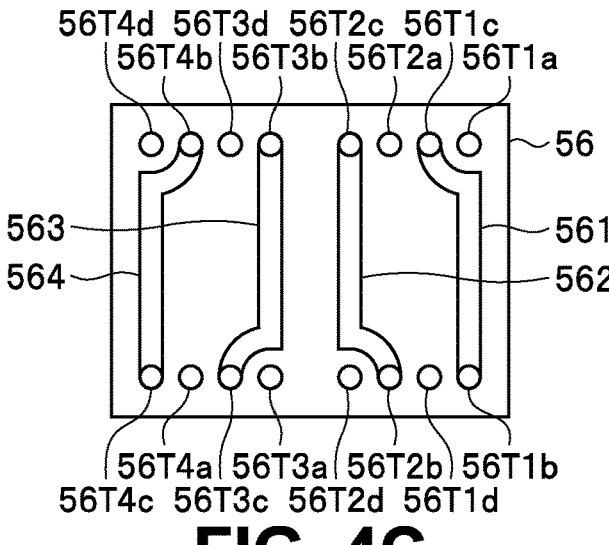

FIG. 4C shows a patterned surface of the sixth dielectric layer 56. Resonator conductor layers 561, 562, 563, and 564 are formed on the patterned surface of the dielectric layer 56. The through holes 55T1a, 55T1d, 55T2a, 55T2d, 55T3a, 55T3d, 55T4a, and 55T4d are connected respectively to the through holes 56T1a, 56T1d, 56T2a, 56T2d, 56T3a, 56T3d, 56T4a, and 56T4d shown in FIG. 4C.

The through hole 55T1b, and a through hole 56T1b shown in FIG. 4C are connected to a portion near the first end of the conductor layer 561. The through hole 55T1c and the through hole 56T1c shown in FIG. 4C are connected to a portion near the second end of the conductor layer 561.

The through hole 55T2b, and a through hole 56T2b shown in FIG. 4C are connected to a portion near the first end of the conductor layer 562. The through hole 55T2c, and the through hole 56T2c shown in FIG. 4C are connected to a portion near the second end of the conductor layer 562.

The through hole 55T3b, and a through hole 56T3b shown in FIG. 4C are connected to a portion near the first end of the conductor layer 563. The through hole 55T3c, and a through hole 56T3c shown in FIG. 4C are connected to a portion near the second end of the conductor layer 563.

The through hole 55T4b, and a through hole 56T4b shown in FIG. 4C are connected to a portion near the first end of the conductor layer 564. The through hole 55T4c, and a through hole 56T4c shown in FIG. 4C are connected to a portion near the second end of the conductor layer 564.

Figure 5A:
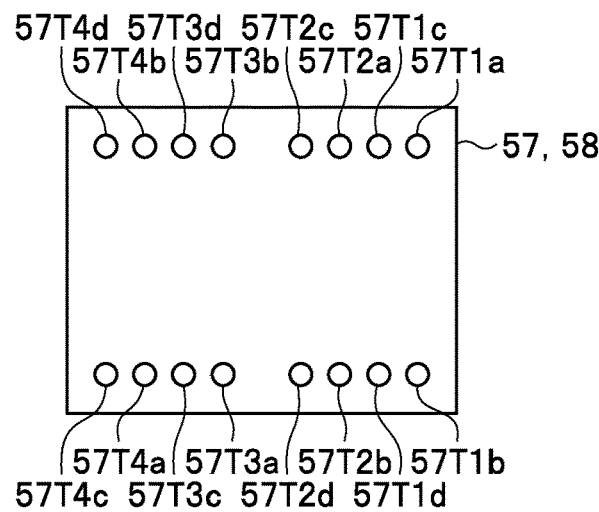
FIG. 5A is an explanatory diagram showing respective patterned surfaces of seventh and eighth dielectric layers of the stack of the multilayered filter device according to the first embodiment of the present invention.

FIG. 5A shows respective patterned surfaces of the seventh and eighth dielectric layers 57 and 58. The through holes 56T1a, 56T1b, 56T1c, 56T1d, 56T2a, 56T2b, 56T2c, 56T2d, 56T3a, 56T3b, 56T3c, 56T3d, 56T4a, 56T4b, 56T4c, and 56T4d are connected respectively to the through holes 57T1a, 57T1b, 57T1c, 57T1d, 57T2a, 57T2b, 57T2c, 57T2d, 57T3a, 57T3b, 57T3c, 57T3d, 57T4a, 57T4b, 57T4c, and 57T4d formed in the dielectric layer 57.

In the dielectric layers 57 and 58, vertically adjacent through holes denoted by the same reference numerals are connected to each other.

Figure 5B:
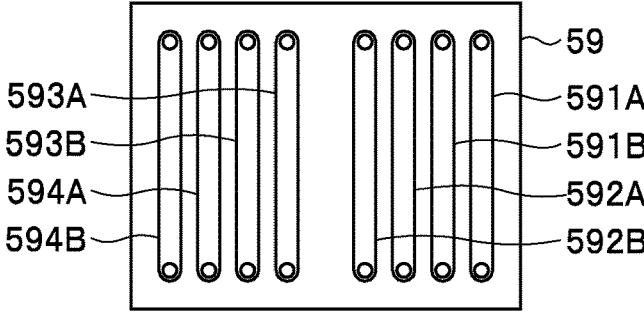
FIG. 5B is an explanatory diagram showing a patterned surface of a ninth dielectric layer of the stack of the multilayered filter device according to the first embodiment of the present invention.

FIG. 5B shows a patterned surface of the ninth dielectric layer 59. Resonator conductor layers 591A, 591B, 592A, 592B, 593A, 593B, 594A, and 594B are formed on the patterned surface of the dielectric layer 59.

The through holes 57T1a and 57T1b formed in the dielectric layer 58 are connected respectively to a portion of the conductor layer 591A near the first end and a portion of the conductor layer 591A near the second end. The through holes 57T1c and 57T1d formed in the dielectric layer 58 are connected respectively to a portion of the conductor layer 591B near the first end and a portion of the conductor layer 591B near the second end. The through holes 57T2a and 57T2b formed in the dielectric layer 58 are connected respectively to a portion of the conductor layer 592A near the first end and a portion of the conductor layer 592A near the second end. The through holes 57T2c and 57T2d formed in the dielectric layer 58 are connected respectively to a portion of the conductor layer 592B near the first end and a portion of the conductor layer 592B near the second end.

The through holes 57T3a and 57T3b formed in the dielectric layer 58 are connected respectively to a portion of the conductor layer 593A near the first end and a portion of the conductor layer 593A near the second end. The through holes 57T3c and 57T3d formed in the dielectric layer 58 are connected respectively to a portion of the conductor layer 593B near the first end and a portion of the conductor layer 593B near the second end. The through holes 57T4a and 57T4b formed in the dielectric layer 58 are connected respectively to a portion of the conductor layer 594A near the first end and a portion of the conductor layer 594A near the second end. The through holes 57T4c and 57T4d formed in the dielectric layer 58 are connected respectively to a portion of the conductor layer 594B near the first end and a portion of the conductor layer 594B near the second end.

Figure 5C:
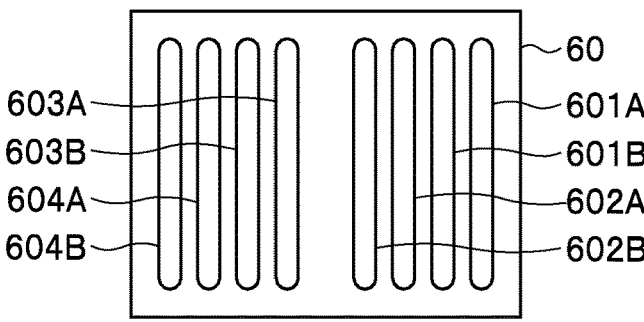
FIG. 5C is an explanatory diagram showing a patterned surface of a tenth dielectric layer of the stack of the multilayered filter device according to the first embodiment of the present invention.

FIG. 5C shows a patterned surface of the tenth dielectric layer 60. Resonator conductor layers 601A, 601B, 602A, 602B, 603A, 603B, 604A, and 604B are formed on the patterned surface of the dielectric layer 60.

Figure 6:
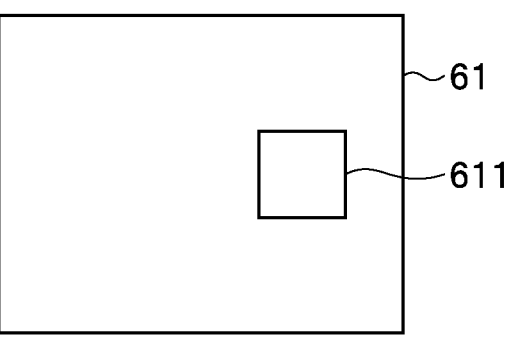
FIG. 6 is an explanatory diagram showing a patterned surface of an eleventh dielectric layer of the stack of the multilayered filter device according to the first embodiment of the present invention.

FIG. 6 shows a patterned surface of the eleventh dielectric layer 61. A mark 611 is formed on the patterned surface of the dielectric layer 61.

The stack 50 shown in FIG. 2 is formed by stacking the first to eleventh dielectric layers 51 to 61 such that the patterned surface of the first dielectric layer 51 serves as the bottom surface 50A of the stack 50 and the surface of the eleventh dielectric layer 61 opposite to the patterned surface thereof serves as the top surface 50B of the stack 50.

Figure 7:
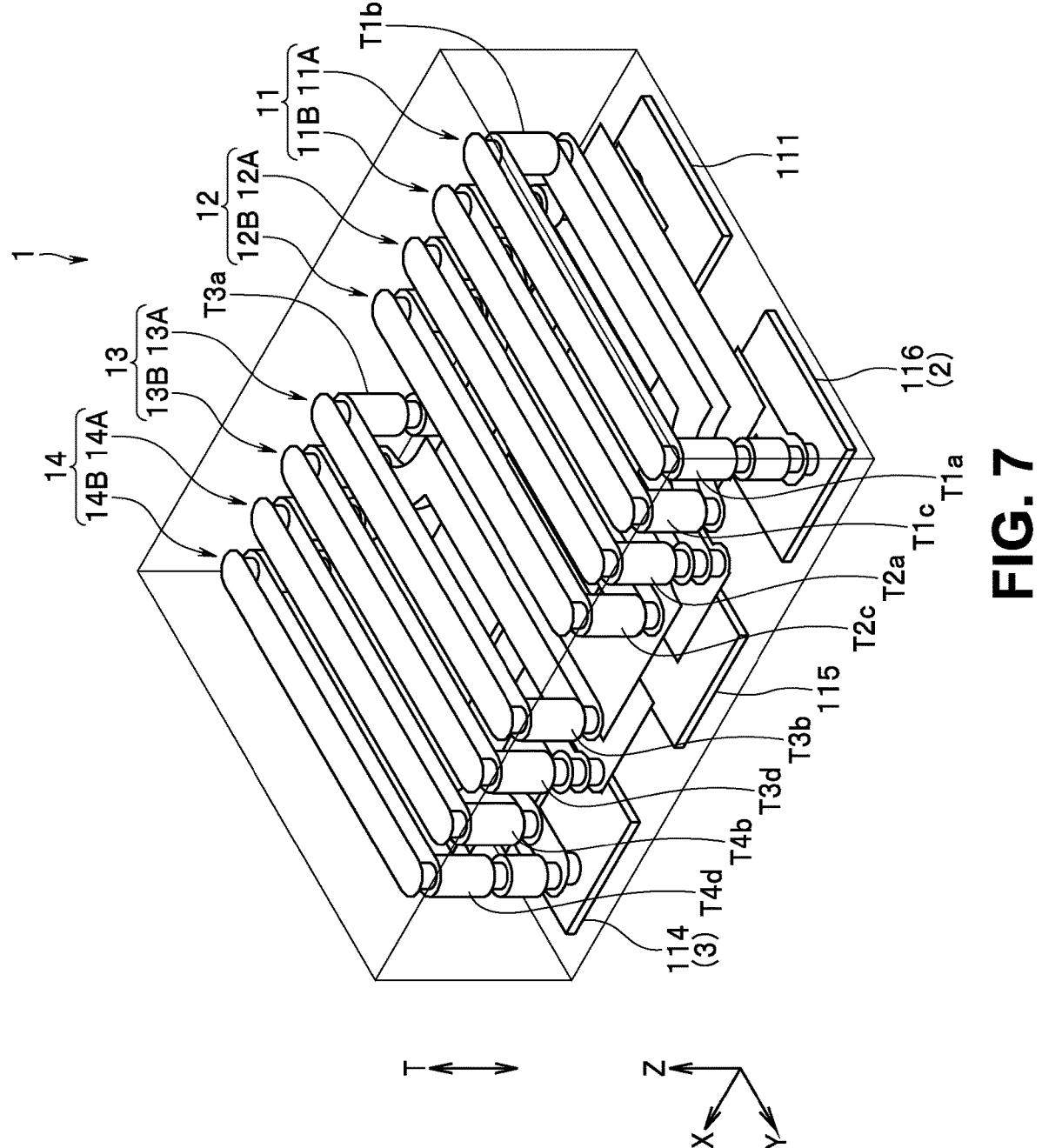
FIG. 7 is a perspective view showing an internal structure of the stack of the multilayered filter device according to the first embodiment of the present invention.

FIG. 7 shows the internal structure of the stack 50 formed by stacking the first to eleventh dielectric layers 51 to 61. As shown in FIG. 7, the plurality of conductor layers and the plurality of through holes shown in FIG. 3A to FIG. 5C are stacked inside the stack 50. In FIG. 7, the mark 611 is omitted.

A correspondence between the circuit components of the filter device 1 shown in FIG. 1 and the internal components of the stack 50 shown in FIG. 3A to FIG. 5C will now be described. The resonator 11 is composed of the inductor conductor layers 551, 561, 591A, 591B, 601A, and 601B, the through holes 52T1a, 53T1a, 53T1d, 54T1a, 54T1d, 55T1a, 55T1b, 55T1c, 55T1d, 56T1a, 56T1b, 56T1c, 56T1d, 57T1a, 57T1b, 57T1c, and 57T1d, and a plurality of through holes connecting a pair of the conductor layers 591A and 601A and a pair of the conductor layers 591B and 601B.

The resonator 12 is composed of the inductor conductor layers 552, 562, 592A, 592B, 602A, and 602B, the through holes 52T2*d*, 53T2*d*, 54T2*a*, 54T2*d*, 55T2*a*, 55T2*b*, 55T2*c*, 55T2*d*, 56T2*a*, 56T2*b*, 56T2*c*, 56T2*d*, 57T2*a*, 57T2*b*, 57T2*c*, and 57T2*d*, and a plurality of through holes connecting a pair of the conductor layers 592A and 602A and a pair of the conductor layers 592B and 602B.

The resonator 13 is composed of the inductor conductor layers 553, 563, 593A, 593B, 603A, and 603B, the through holes 52T3*a*, 53T3*a*, 54T3*a*, 54T3*d*, 55T3*a*, 55T3*b*, 55T3*c*, 55T3*d*, 56T3*a*, 56T3*b*, 56T3*c*, 56T3*d*, 57T3*a*, 57T3*b*, 57T3*c*, and 57T3*d*, and a plurality of through holes connecting a pair of the conductor layers 593A and 603A and a pair of the conductor layers 593B and 603B.

The resonator 14 is composed of the inductor conductor layers 554, 564, 594A, 594B, 604A, and 604B, the through holes 52T4*d*, 53T4*a*, 53T4*d*, 54T4*a*, 54T4*d*, 55T4*a*, 55T4*b*, 55T4*c*, 55T4*d*, 56T4*a*, 56T4*b*, 56T4*c*, 56T4*d*, 57T4*a*, 57T4*b*, 57T4*c*, and 57T4*d*, and a plurality of through holes connecting a pair of the conductor layers 594A and 604A and a pair of the conductor layers 594B and 604B.

The inductor L1 is mainly formed by the through hole connecting the electrode 116 and the conductor layer 521. The inductor L2 is mainly formed by the through hole connecting the electrode 114 and the conductor layer 522. The inductor L3 is mainly formed by the two through holes connecting the electrode 112 and the conductor layer 527.

The capacitor C1 is composed of the conductor layers 521 and 531 and the dielectric layer 52 between those conductor layers. The capacitor C2 is composed of the conductor layers 522 and 534 and the dielectric layer 52 between those conductor layers. The capacitor C3 is composed of the conductor layers 523 and 531, and the dielectric layer 52 between those conductor layers. The capacitor C4 is composed of the conductor layers 524 and 532 and the dielectric layer 52 between those conductor layers. The capacitor C5 is composed of the conductor layers 525 and 533 and the dielectric layer 52 between those conductor layers. The capacitor C6 is composed of the conductor layers 526 and 534 and the dielectric layer 52 between those conductor layers.

The capacitor C7 is floating capacitance composed of the resonators 11 and 14 and a plurality of conductors constituting the inductors L1 and L2.

The capacitor C12 is composed of the conductor layers 531 and 541 and the dielectric layer 53 between those conductor layers. The capacitor C23 is composed of the conductor layers 532, 533, and 542, and the dielectric layer 53 between those conductor layers. The capacitor C34 is composed of the conductor layers 534 and 543 and the dielectric layer 53 between those conductor layers.

Figure 8:
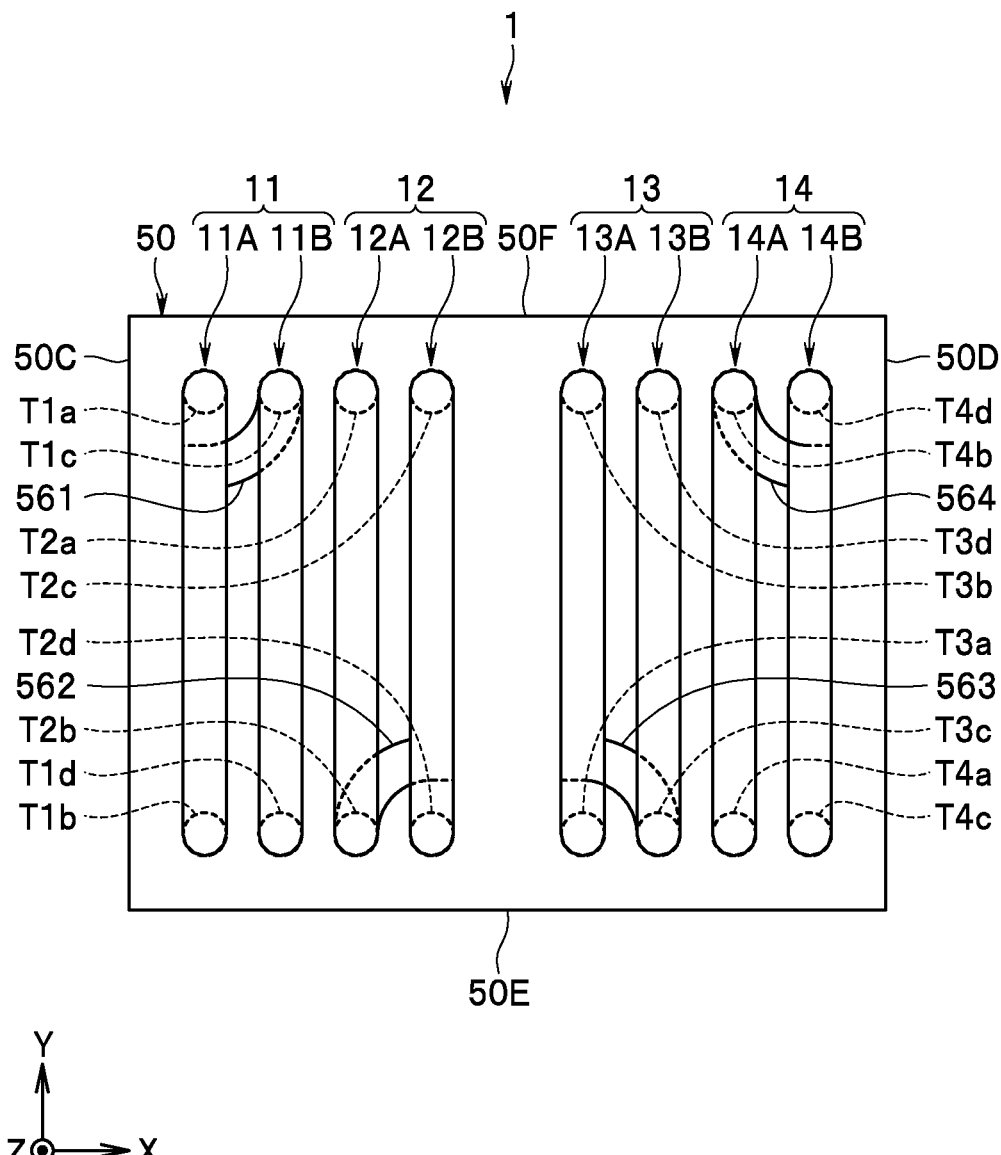
FIG. 8 is a plan view showing an internal structure of the stack of the multilayered filter device according to the first embodiment of the present invention.

Next, the structural features of the filter device 1 according to the present embodiment will be described with reference to FIG. 1 to FIG. 8. FIG. 8 is a plan view showing part of an internal structure of the stack 50, specifically the resonators 11 to 14.

Each of the resonators 11 to 14 is also a rectangular or approximately rectangular winding. For the rectangular or approximately rectangular winding, the number of windings may be counted, when the winding is regarded as a rectangle, as ¼ per side of the rectangle. Each of the resonators 11 to 14 includes a plurality of portions each having the number of windings of ¾. In particular, in the present embodiment, each of the resonators 11 to 14 includes the first portion and the second portion described above as the plurality of portions. In other words, the number of windings of each of the first and second portions is ¾.

The number of windings of each of the resonators 11 to 14 is ¾ or more. In the present embodiment, each of the resonators 11 to 14 is wound ¾ times around an axis extending in the direction orthogonal to the stacking direction T.

As shown in FIG. 8, each of the resonators 11 to 14 is wound around an axis extending in a direction parallel to the X direction. Note that the posture of each of the resonators 11 to 14 is any without being limited to the example shown in FIG. 8 as long as the requirements of the first and second portions to be described below are satisfied. At least one of the resonators 11 to 14 may be wound around an axis extending in a direction inclined toward a direction parallel to the X direction.

The resonator 11 has an opening surrounded by a plurality of conductors (plurality of conductor layers and plurality of through holes) constituting the resonator 11. The resonator 12 has an opening surrounded by a plurality of conductors constituting the resonator 12. The resonator 13 has an opening surrounded by a plurality of conductors constituting the resonator 13. The resonator 14 has an opening surrounded by a plurality of conductors constituting the resonator 14.

As shown in FIG. 7 and FIG. 8, each of the resonators 11 to 14 is arranged in a manner that an opening of each of the resonator faces an opening(s) of one or two other resonators among the resonators 11 to 14. Specifically, the resonators 11 to 14 are arranged in a manner that the opening of the resonator 11 and the opening of the resonator 12 face each other, the opening of the resonator 12 and the opening of the resonator 13 face each other, and the opening of the resonator 13 and the opening of the resonator 14 face each other. In the present embodiment, the resonator 11 is arranged near the side surface 50C. The resonator 14 is arranged near the side surface 50D. The resonators 12 is arranged between resonator 11 and the resonator 14. The resonator 13 is arranged between the resonator 12 and the resonator 14. The resonators 11 to 14 are arranged in this order in the X direction when seen in the stacking direction T.

As employed herein, a structure formed by connecting two or more through holes in series will be referred to as a through hole line. The first portion 11A of the resonator 11 includes through hole lines T1*a* and T1*b*. The through hole line T1*a* is formed with the through holes 52T1*a*, 53T1*a*, 54T1*a*, 55T1*a*, 56T1*a*, and 57T1*a*. The through hole line T1*b* is formed with the through holes 56T1*b* and 57T1*b*. The first portion 11A further includes the conductor layer 591A connected to one end portion of each of the through hole lines T1*a* and T1*b*, the conductor layer 601A, and two through holes connecting a pair of the conductor layers 591A and 601A.

The second portion 11B of the resonator 11 includes through hole lines T1*c* and T1*d*. The through hole line T1*c* is formed with the through holes 56T1*c* and 57T1*c*. The through hole line T1*d* is formed with the through holes 53T1*d*, 54T1*d*, 55T1*d*, 56T1*d*, and 57T1*d*. The second portion 11B further includes the conductor layer 591B connected to one end portion of each of the through hole lines T1*c* and T1*d*, the conductor layer 601B, and two through holes connecting a pair of the conductor layers 591B and 601B.

The first portion 12A of the resonator 12 includes through hole lines T2*a* and T2*b*. The through hole line T2*a* is formed with the through holes 54T2*a*, 55T2*a*, 56T2*a*, and 57T2*a*. The through hole line T2*b* is formed with the through holes 56T2*b* and 57T2*b*. The first portion 12A further includes the conductor layer 592A connected to one end portion of each of the through hole lines T2*a* and T2*b*, the conductor layer 602A, and two through holes connecting a pair of the conductor layers 592A and 602A.

The second portion 12B of the resonator 12 includes through hole lines T2*c* and T2*d*. The through hole line T2*c* is formed with the through holes 56T1*c* and 57T1*c*. The through hole line T2*d* is formed with the through holes 52T2*d*, 53T2*d*, 54T2*d*, 55T2*d*, 56T2*d*, and 57T2*d*. The second portion 12B further includes the conductor layer 592B connected to one end portion of each of the through hole lines T2*c* and T2*d*, the conductor layer 602B, and two through holes connecting a pair of the conductor layers 592B and 602B.

The first portion 13A of the resonator 13 includes through hole lines T3*a* and T3*b*. The through hole line T3*a* is formed with the through holes 52T3*a*, 53T3*a*, 54T3*a*, 55T3*a*, 56T3*a*, and 57T3*a*. The through hole line T3*b* is formed with the through holes 56T3*b* and 57T3*b*. The first portion 13A further includes the conductor layer 593A connected to one end portion of each of the through hole lines T3*a* and T3*b*, the conductor layer 603A, and two through holes connecting a pair of the conductor layers 593A and 603A.

The second portion 13B of the resonator 13 includes through hole lines T3*c* and T3*d*. The through hole line T3*c* is formed with the through holes 56T3*c* and 57T3*c*. The through hole line T3*d* is formed with the through holes 54T3*d*, 55T3*d*, 56T3*d*, and 57T3*d*. The second portion 13B further includes the conductor layer 593B connected to one end portion of each of the through hole lines T3*c* and T3*d*, the conductor layer 603B, and two through holes connecting a pair of the conductor layers 593B and 603B.

The first portion 14A of the resonator 14 includes through hole lines T4*a* and T4*b*. The through hole line T4*a* is formed with the through holes 53T4*a*, 54T4*a*, 55T4*a*, 56T4*a*, and 57T4*a*. The through hole line T4*b* is formed with the through holes 56T4*b* and 57T4*b*. The first portion 14A further includes the conductor layer 594A connected to one end portion of each of the through hole lines T4*a* and T4*b*, the conductor layer 604A, and two through holes connecting a pair of the conductor layers 594A and 604A.

The second portion 14B of the resonator 14 includes through hole lines T4*c* and T4*d*. The through hole line T4*c* is formed with the through holes 56T4*c* and 57T4*c*. The through hole line T4*d* is formed with the through holes 52T4*d*, 53T4*d*, 54T4*d*, 55T4*d*, 56T4*d*, and 57T4*d*. The second portion 14B further includes the conductor layer 594B connected to one end portion of each of the through hole lines T4*c* and T4*d*, the conductor layer 604B, and two through holes connecting a pair of the conductor layers 594B and 604B.

Next, the first portion and the second portion of each of the resonators 11 to 14 will be described in detail. The first portion 11A and the second portion 11B of the resonator 11 are arranged with a certain distance in a direction parallel to the axis around which the resonator 11 is wound, in other words, a direction parallel to the X direction. In particular, in the present embodiment, the second portion 11B is arranged ahead of the first portion 11A in the X direction. The number of windings of each of the first portion 11A and the second portion 11B is ¾.

The first portion 11A has an opening surrounded by a conductor constituting the first portion 11A. The second portion 11B has an opening surrounded by a conductor constituting the second portion 11B. The first portion 11A and the second portion 11B are arranged in a manner that the opening of the first portion 11A and the opening of the second portion 11B face each other.

The first portion 11A and the second portion 11B are electrically connected to each other by the conductor layers 551 and 561 and the through holes 55T1*b* and 55T1*c*. When seen in a direction parallel to the axis described above, for example, the X direction, the direction of a current flowing through the first portion 11A and the direction of a current flowing through the second portion 11B are the same. In other words, when seen in the X direction, a direction from one end portion of the first portion 11A closest to the ground in the circuit configuration toward the other end portion of the first portion 11A furthest from the ground in the circuit configuration and a direction from one end portion of the second portion 11B closest to the ground in the circuit configuration toward the other end portion of the second portion 11B furthest from the ground in the circuit configuration are the same.

The above description about the first portion 11A and the second portion 11B of the resonator 11 also applies to the first portion 12A and the second portion 12B of the resonator 12. By replacing the resonator 11, the first portion 11A, the second portion 11B, the conductor layers 551 and 561, and the through holes 55T1*b* and 55T1*c* in the above description about the first portion 11A and the second portion 11B of the resonator 11 respectively with the resonator 12, the first portion 12A, the second portion 12B, the conductor layers 552 and 562, and the through holes 55T2*b* and 55T2*c*, the above description about the first and second portions 11A, 11B of the resonator 11 serves as a description about the first portion 12A and the second portion 12B of the resonator 12.

Similarly, the above description about the first portion 11A and the second portion 11B of the resonator 11 also applies to the first portion 13A and the second portion 13B of the resonator 13. By replacing the resonator 11, the first portion 11A, the second portion 11B, the conductor layers 551 and 561, and the through holes 55T1*b* and 55T1*c* in the above description about the first portion 11A and the second portion 11B of the resonator 11 respectively with the resonator 13, the first portion 13A, the second portion 13B, the conductor layers 553 and 563, and the through holes 55T3*b* and 55T3*c*, the above description about the first and second portions 11A, 11B of the resonator 11 serves as a description about the first portion 13A and the second portion 13B of the resonator 13.

Similarly, the above description about the first portion 11A and the second portion 11B of the resonator 11 also applies to the first portion 14A and the second portion 14B of the resonator 14. By replacing the resonator 11, the first portion 11A, the second portion 11B, the conductor layers 551 and 561, and the through holes 55T1*b* and 55T1*c* in the above description about the first portion 11A and the second portion 11B of the resonator 11 respectively with the resonator 14, the first portion 14A, the second portion 14B, the conductor layers 554 and 564, and the through holes 55T4*b* and 55T4*c*, the above description about the first and second portions 11A, 11B of the resonator 11 serves as a description about the first portion 14A and the second portion 14B of the resonator 14.

The resonator 11 and the resonator 12 are adjacent to each other in the circuit configuration. The resonator 11 and the resonator 12 are also physically adjacent to each other as described below. The second portion 11B of the resonator 11 and the first portion 12A of the resonator 12 are adjacent to each other in the stack 50. The second portion 11B of the resonator 11 and the first portion 12A of the resonator 12 are arranged between the first portion 11A of the resonator 11 and the second portion 12B of the resonator 12 in the stack 50.

Due to the arrangement of the resonator 11 and the resonator 12, the electromagnetic coupling between the second portion 11B and the first portion 12A is stronger than electromagnetic coupling between the first portion 11A and the first portion 12A and is also stronger than electromag- netic coupling between the second portion 11B and the second portion 12B.

The distance between the second portion 11B and the first portion 12A, in other words, the distance between the resonator 11 and the resonator 12 may be the same as or different from the distance between the first portion 11A and the second portion 11B of the resonator 11. Similarly, the distance between the resonator 11 and the resonator 12 may be the same as or different from the distance between the first portion 12A and the second portion 12B of the resonator 12.

The above description about the pair of the resonator 11 and the resonator 12 also applies to the pair of the resonator 12 and the resonator 13. By replacing the resonator 11, the resonator 12, the first portion 11A, the first portion 12A, the second portion 11B, and the second portion 12B in the above description about the pair of the resonator 11 and the resonator 12 respectively with the resonator 12, the resona- tor 13, the first portion 12A, the first portion 13A, the second portion 12B, and the second portion 13B, the above descrip- tion about the pair of the resonators 11, 12 serves as a description about the pair of the resonator 12 and the resonator 13. Note that FIG. 7 and FIG. 8 show an example where the distance between the resonator 12 and the reso- nator 13 is larger than the distance between the first portion 12A and the second portion 12B of the resonator 12 and is larger than the distance between the first portion 13A and the second portion 13B of the resonator 13.

Similarly, the above description about the pair of the resonator 11 and the resonator 12 also applies to the pair of the resonator 13 and the resonator 14. By replacing the resonator 11, the resonator 12, the first portion 11A, the first portion 12A, the second portion 11B, and the second portion 12B in the above description about the pair of the resonator 11 and the resonator 12 respectively with the resonator 13, the resonator 14, the first portion 13A, the first portion 14A, the second portion 13B, and the second portion 14B, the above description about the pair of the resonators 11, 12 serves as a description about the pair of the resonator 13 and the resonator 14.

Figure 9:
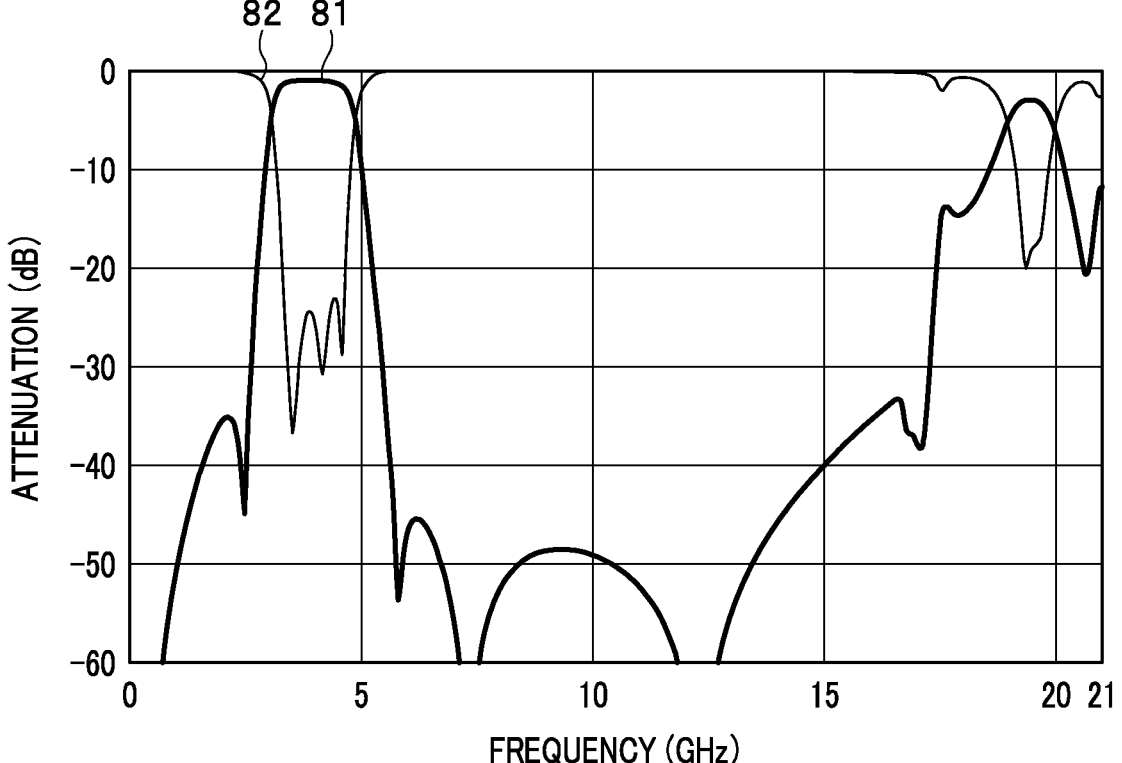
FIG. 9 is a characteristic chart showing an example of characteristics of the multilayered filter device according to the first embodiment of the present invention.

Next, an example of characteristics of the filter device 1 according to the present embodiment will be described. FIG. 9 is a characteristic chart showing an example of pass attenuation characteristics and return attenuation character- istics of the filter device 1. In FIG. 9, the horizontal axis represents frequency, and the vertical axis represents attenu- ation. In FIG. 9, a curve denoted by a reference numeral 81 represents the pass attenuation characteristics, and a curve denoted by a reference numeral 82 represents the return attenuation characteristics. As shown in FIG. 9, the filter device 1 practically has sufficient characteristics as a band- pass filter.

Next, operation and effects of the filter device 1 according to the present embodiment will be described. In the present embodiment, the resonator 11 includes the first portion 11A and the second portion 11B. With this, according to the present embodiment, the inductance of the resonator 11 can be increased compared with a case where the resonator 11 only includes the first portion 11A or the second portion 11B. In the present embodiment, the first portion 11A and the second portion 11B are arranged with a certain distance in a direction parallel to the X direction. With this, according to the present embodiment, when the size of the stack 50, in other words, the filter device 1, in the Z direction is reduced, the opening of each of the first portion 11A and the second portion 11B can be prevented from being too small. In particular, according to the present embodiment, the opening of the first portion 11A or the opening of the second portion 11B can be prevented from being too small compared with a case where one of the first portion 11A and the second portion 11B is arranged on an inner side of the other.

The above description about the resonator 11 also applies to the resonators 12 to 14.

In the present embodiment, the resonator 11 and the resonator 12 adjacent to each other in the circuit configu- ration are arranged also to be physically adjacent to each other. Similarly, the resonator 12 and the resonator 13 adjacent to each other in the circuit configuration are arranged also to be physically adjacent to each other. Simi- larly, the resonator 13 and the resonator 14 adjacent to each other in the circuit configuration are arranged also to be physically adjacent to each other. With this, according to the present embodiment, the stack 50, in other words, the filter device 1, can be miniaturized compared with a case where two resonators adjacent to each other in the circuit configu- ration are not physically adjacent to each other.

In view of the above, according to the present embodi- ment, it is possible to achieve miniaturization while achiev- ing desired characteristics.

Second Embodiment

Figure 10:
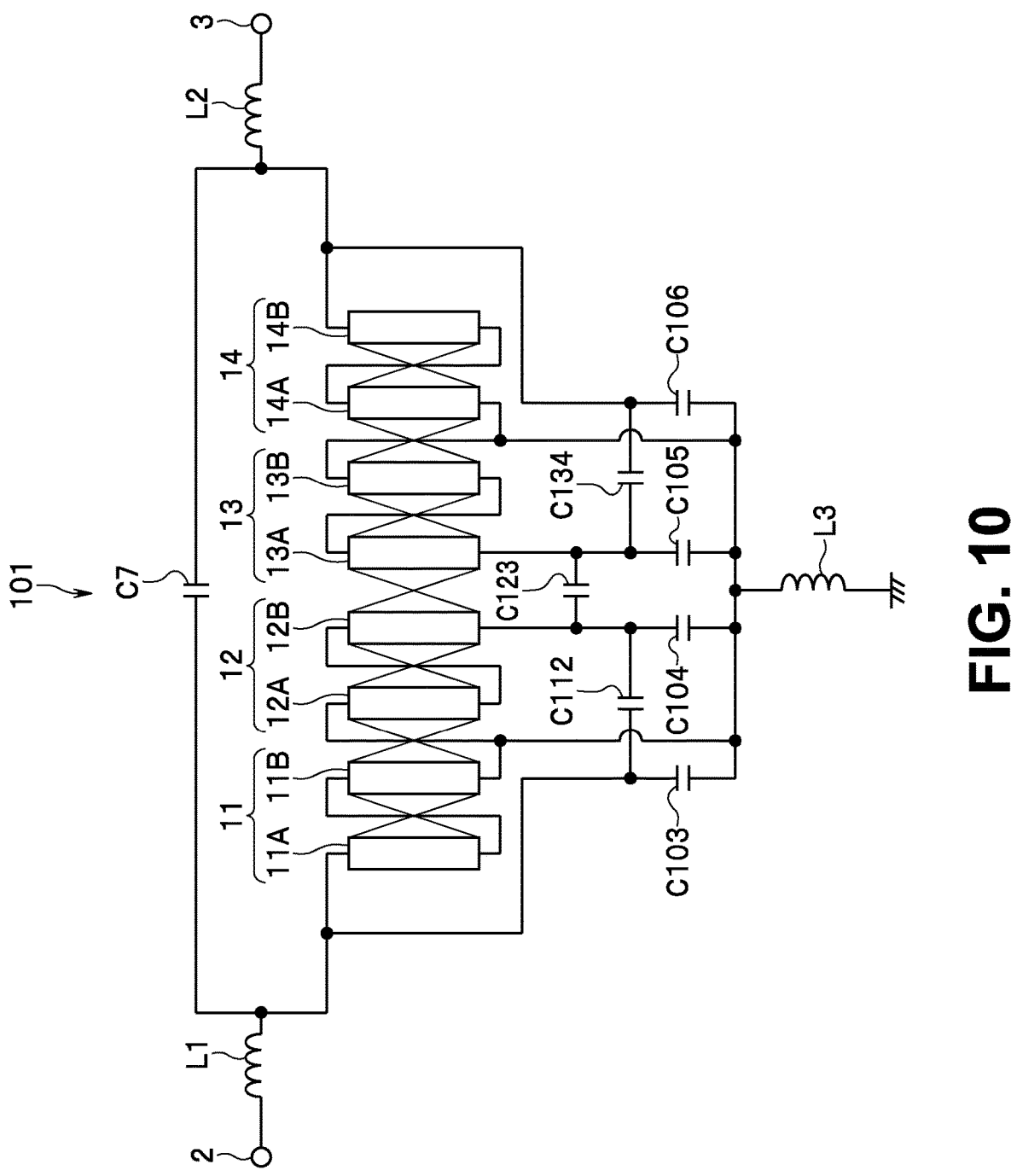
FIG. 10 is a circuit diagram showing a circuit configuration of a multilayered filter device according to a second embodiment of the present invention.

Next, a second embodiment of the present invention will be described with reference to FIG. 10. FIG. 10 is a circuit diagram showing a circuit configuration of a filter device 101 according to the present embodiment. The filter device 101, as the filter device 1 according to the first embodiment, includes the first signal terminal 2, the second signal termi- nal 3, the four resonators 11, 12, 13, and 14, the inductors L1, L2, and L3, and the capacitor C7. The configurations and arrangements of the resonators 11 to 14 are basically similar to those in the first embodiment.

The filter device 101 further includes capacitors C103, C104, C105, C106, C112, C123, and C134. A circuit con- figuration of the filter device 101 will be described below in detail with reference to FIG. 10. One end of the inductor L1 is connected to the first signal terminal 2. The other end of the inductor L1 is connected to one end of the first portion 11A of the resonator 11. The other end of the first portion 11A is connected to one end of the second portion 11B of the resonator 11. The other end of the second portion 11B is connected to one end of the first portion 12A of the resonator 12. The other end of the first portion 12A is connected to one end of the second portion 12B of the resonator 12.

One end of the capacitor C112 is connected to the one end of the first portion 11A of the resonator 11. The other end of the capacitor C112 and one end of the capacitor C123 are connected to the other end of the second portion 12B of the resonator 12.

The other end of the capacitor C123 is connected to one end of the first portion 13A of the resonator 13. The other end of the first portion 13A is connected to one end of the second portion 13B of the resonator 13. The other end of the second portion 13B is connected to one end of the first portion 14A of the resonator 14. The other end of the first portion 14A is connected to one end of the second portion 14B of the resonator 14. The other end of the second portion 14B is connected to one end of the inductor L2. The other end of the inductor L2 is connected to the second signal terminal 3.

One end of the capacitor C134 is connected to the one end of the first portion 13A of the resonator 13. The other end of the capacitor C134 is connected to the other end of the second portion 14B of the resonator 14.

One end of the capacitor C103 is connected to the one end of the first portion 11A of the resonator 11. One end of the capacitor C104 is connected to the other end of the second portion 12B of the resonator 12. One end of the capacitor C105 is connected to the one end of the first portion 13A of the resonator 13. One end of the capacitor C106 is connected to the other end of the second portion 14B of the resonator 14. The other end of each of the capacitors C103 to C106 is grounded via the inductor L3.

One end of the capacitor C7 is connected to the other end of the inductor L1. The other end of the capacitor C7 is connected to the one end of the inductor L2.

The other end of the second portion 11B of the resonator 11, the one end of the first portion 12A of the resonator 12, the other end of the second portion 13B of the resonator 13, the one end of the first portion 14A of the resonator 14 are each grounded via the inductor L3. In other words, in the present embodiment, each of the resonators 11 to 14 is electrically grounded via the inductor L3.

In the example shown in FIG. 10, the filter device 101 has a circuit configuration symmetric with respect to the inductor L3 and the capacitor C123.

The configuration, operation, and effects of the present embodiment are otherwise the same as those of the first embodiment.

The present invention is not limited to the foregoing embodiments, and various modifications may be made thereto. For example, the configuration of each of the resonators 11 to 14 in the present invention is any without being limited to the example shown in each of the embodiments as long as satisfying the requirements of the claims. The filter device of the present invention may include a resonator other than the resonators 11 to 14.

The resonators 11 to 14 of the present invention may be part of a branching filter.

As described above, a multilayered filter device of the present invention includes a first signal terminal, a second signal terminal, a plurality of resonators provided between the first signal terminal and the second signal terminal in a circuit configuration, and a stack for integrating the first signal terminal, the second signal terminal, and the plurality of resonators, the stack including a plurality of dielectric layers stacked together. Each of the plurality of resonators is wound around an axis orthogonal to a stacking direction of the plurality of dielectric layers and is arranged in a manner that an opening of each of the resonators faces one or more openings of one or two other resonators among the plurality of resonators. The plurality of resonators include a first resonator and a second resonator adjacent to each other in the circuit configuration. Each of the first resonator and the second resonator includes a first portion and a second portion arranged with a certain distance in a direction parallel to the axis. The second portion of the first resonator and the first portion of the second resonator are adjacent to each other.

In the multilayered filter device of the present invention, the second portion of the first resonator and the first portion of the second resonator may be arranged between the first portion of the first resonator and the second portion of the second resonator.

In the multilayered filter device of the present invention, the electromagnetic coupling between the second portion of the first resonator and the first portion of the second resonator may be stronger than electromagnetic coupling between the first portion of the first resonator and the first portion of the second resonator.

In the multilayered filter device according to the present invention, the first portion and the second portion may be connected in series.

In the multilayered filter device of the present invention, a direction of a current flowing through the first portion and a direction of a current flowing through the second portion may be the same when seen in a direction parallel to the axis.

In the multilayered filter device of the present invention, the distance between the first portion and the second portion in each of the first resonator and the second resonator may be equal to or smaller than a distance between the first resonator and the second resonator.

In the multilayered filter device of the present invention, each of the plurality of resonators may include a plurality of portions each having the number of windings of ¾. The numbers of windings of the plurality of respective resonators may be the same.

In the multilayered filter device of the present invention, the plurality of resonators may include three pairs of the first resonator and the second resonator.

In the multilayered filter device of the present invention, the plurality of resonators may include four resonators. One resonator of the four resonators may be connected to the first signal terminal. One other resonator of the four resonators may be connected to the second signal terminal. Remaining two resonators of the four resonators may be provided between the one resonator and the one other resonator in the circuit configuration. Each of the one resonator and the one other resonator may not be electrically grounded. Alternatively, each of the one resonator and the one other resonator may be electrically grounded.

Obviously, many modifications and variations of the present invention are possible in the light of the above teachings. Thus, it is to be understood that, within the scope of the appended claims and equivalents thereof, the present invention may be practiced in other embodiments than the foregoing most preferable embodiment.

What is claimed is:

1. A multilayered filter device comprising:

a first signal terminal;

a second signal terminal;

a plurality of resonators provided between the first signal terminal and the second signal terminal in a circuit configuration; and a stack for integrating the first signal terminal, the second signal terminal, and the plurality of resonators, the stack including a plurality of dielectric layers stacked together, wherein each of the plurality of resonators is wound around an axis orthogonal to a stacking direction of the plurality of dielectric layers and is arranged in a manner that an opening of each of the resonators faces one or more openings of one or two other resonators among the plurality of resonators, the plurality of resonators include a first resonator and a second resonator adjacent to each other in a circuit configuration, the first resonator includes a first portion and a second portion arranged with a certain distance in a direction parallel to the axis of the first resonator, the second resonator includes a first portion and a second portion arranged with a certain distance in a direction parallel to the axis of the second resonator, and the second portion of the first resonator and the first portion of the second resonator are adjacent to each other in a direction orthogonal to the stacking direction.

2. The multilayered filter device according to claim 1, wherein the second portion of the first resonator and the first portion of the second resonator are arranged between the first portion of the first resonator and the second portion of the second resonator.

3. A multilayered filter device comprising:

a first signal terminal;

a second signal terminal;

a plurality of resonators provided between the first signal terminal and the second signal terminal in a circuit configuration; and a stack for integrating the first signal terminal, the second signal terminal, and the plurality of resonators, the stack including a plurality of dielectric layers stacked together, wherein each of the plurality of resonators is wound around an axis orthogonal to a stacking direction of the plurality of dielectric layers and is arranged in a manner that an opening of each of the resonators faces one or more openings of one or two other resonators among the plurality of resonators, the plurality of resonators include a first resonator and a second resonator adjacent to each other in a circuit configuration, each of the first resonator and the second resonator includes a first portion and a second portion arranged with a certain distance in a direction parallel to the axis, and the second portion of the first resonator and the first portion of the second resonator are adjacent to each other, wherein electromagnetic coupling between the second portion of the first resonator and the first portion of the second resonator is stronger than electromagnetic coupling between the first portion of the first resonator and the first portion of the second resonator.

4. The multilayered filter device according to claim 1, wherein the first portion of the first resonator and the second portion of the first resonator are connected in series, and the first portion of the second resonator and the second portion of the second resonator are connected in series.

5. The multilayered filter device according to claim 1, wherein a direction of a current flowing through the first portion of the first resonator and a direction of a current flowing through the second portion of the first resonator are the same when seen in the direction parallel to the axis of the first resonator, and a direction of a current flowing through the first portion of the second resonator and a direction of a current flowing through the second portion of the second resonator are the same when seen in the direction parallel to the axis of the second resonator.

6. The multilayered filter device according to claim 1, wherein the distance between the first portion and the second portion in each of the first resonator and the second resonator is equal to or smaller than a distance between the first resonator and the second resonator.

7. A multilayered filter device comprising:

a first signal terminal;

a second signal terminal;

a plurality of resonators provided between the first signal terminal and the second signal terminal in a circuit configuration; and a stack for integrating the first signal terminal, the second signal terminal, and the plurality of resonators, the stack including a plurality of dielectric layers stacked together, wherein each of the plurality of resonators is wound around an axis orthogonal to a stacking direction of the plurality of dielectric layers and is arranged in a manner that an opening of each of the resonators faces one or more openings of one or two other resonators among the plurality of resonators, the plurality of resonators include a first resonator and a second resonator adjacent to each other in a circuit configuration, each of the first resonator and the second resonator includes a first portion and a second portion arranged with a certain distance in a direction parallel to the axis, and the second portion of the first resonator and the first portion of the second resonator are adjacent to each other, wherein each of the plurality of resonators includes a plurality of portions each having the number of windings of $3/4$.

8. The multilayered filter device according to claim 7, wherein the numbers of windings of the plurality of respective resonators are the same.

9. The multilayered filter device according to claim 1, wherein the plurality of resonators include three pairs of the first resonator and the second resonator.

10. The multilayered filter device according to claim 1, wherein the plurality of resonators include four resonators, one resonator of the four resonators is connected to the first signal terminal, one other resonator of the four resonators is connected to the second signal terminal, and remaining two resonators of the four resonators are provided between the one resonator and the one other resonator in the circuit configuration.

11. The multilayered filter device according to claim 10, wherein each of the one resonator and the one other resonator is not electrically grounded.

12. The multilayered filter device according to claim 10, wherein each of the one resonator and the one other resonator is electrically grounded.

* * * * *